(12) United States Patent
Yoshizumi et al.

(10) Patent No.: US 8,513,645 B2
(45) Date of Patent: Aug. 20, 2013

(54) GALLIUM NITRIDE-BASED EPITAXIAL WAFER AND METHOD OF PRODUCING GALLIUM NITRIDE-BASED SEMICONDUCTOR LIGHT-EMITTING DEVICE

(75) Inventors: Yusuke Yoshizumi, Itami (JP); Masaki Ueno, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 800 days.

(21) Appl. No.: 12/532,077

(22) PCT Filed: Feb. 20, 2008

(86) PCT No.: PCT/JP2008/052865
§ 371 (c)(1),
(2), (4) Date: Sep. 18, 2009

(87) PCT Pub. No.: WO2008/117595
PCT Pub. Date: Oct. 2, 2008

(65) Prior Publication Data
US 2010/0102297 A1   Apr. 29, 2010

(30) Foreign Application Priority Data
Mar. 28, 2007   (JP) .................................. 2007-085439

(51) Int. Cl.
*H01L 33/00* (2010.01)
*H01L 29/12* (2006.01)
(52) U.S. Cl.
USPC .................... 257/14; 438/47; 257/13; 257/76

(58) Field of Classification Search
USPC ................. 257/13, 14, 76, E33.013, E33.005
See application file for complete search history.

(56) References Cited

U.S. PATENT DOCUMENTS

| 5,840,124 A * | 11/1998 | Gurary et al. ................. 118/726 |
| 7,755,103 B2 * | 7/2010 | Ueno ............................ 257/190 |
| 7,883,996 B2 * | 2/2011 | Ueno ............................ 438/483 |
| 2001/0021593 A1 * | 9/2001 | Sakai et al. ................... 438/784 |
| 2003/0160229 A1 * | 8/2003 | Narayan et al. ................. 257/14 |

(Continued)

FOREIGN PATENT DOCUMENTS

| JP | 63-226025 | 9/1988 |
| JP | 63226025 A * | 9/1988 |

(Continued)

*Primary Examiner* — Long K Tran
*Assistant Examiner* — Jordan Klein
(74) *Attorney, Agent, or Firm* — Venable LLP; Michael A. Sartori; Tamatane J. Aga

(57) ABSTRACT

A source gas flows through a flow channel 23 of a metal-organic vapor phase epitaxy reactor 21. The source gas is fed in a direction across a main surface 25a of a susceptor 25. GaN substrates 27a to 27c are placed on the susceptor main surface 25a. An off-angle monotonically varies on a line segment extending from one point on the edges of the main surfaces of the gallium nitride substrates 27a to 27c to another point on the edges. The orientations of the GaN substrates 27a to 27c are represented by the orientations of the orientation flats. By placing the plurality of gallium nitride substrates 27a to 27c on the susceptors 25 of the metal-organic vapor phase epitaxy reactor 21 in these orientations, the influence of the off-angle distribution can be reduced by using the influence originated from the flow of the source gas.

10 Claims, 15 Drawing Sheets

(56) References Cited

U.S. PATENT DOCUMENTS

| | | |
|---|---|---|
| 2003/0160246 A1* | 8/2003 | Narayan et al. ............... 257/79 |
| 2005/0023544 A1 | 2/2005 | Shibata |
| 2005/0092248 A1* | 5/2005 | Lee et al. ..................... 118/715 |
| 2005/0161689 A1* | 7/2005 | Narayan et al. ............... 257/97 |
| 2005/0224783 A1* | 10/2005 | Matsuyama et al. ........... 257/14 |
| 2005/0274975 A1* | 12/2005 | Shibata ......................... 257/183 |
| 2005/0274976 A1* | 12/2005 | Shibata ......................... 257/189 |
| 2006/0102081 A1* | 5/2006 | Ueno et al. .................... 118/728 |
| 2006/0219998 A1* | 10/2006 | Sato et al. ...................... 257/12 |
| 2008/0017099 A1 | 1/2008 | Onomura et al. |

FOREIGN PATENT DOCUMENTS

| | | |
|---|---|---|
| JP | 10-12554 A | 1/1998 |
| JP | 2001-250783 | 9/2001 |
| JP | 2002-367907 | 12/2002 |
| JP | 2005-136408 | 5/2005 |
| JP | 2005-159047 | 6/2005 |
| JP | 2005-206424 | 8/2005 |
| JP | 2005206424 A * | 8/2005 |
| JP | 2005-350315 | 12/2005 |
| JP | 2006-066869 | 3/2006 |
| JP | 2006-173560 | 6/2006 |
| JP | 2006-310819 | 11/2006 |

* cited by examiner

GALLIUM NITRIDE-BASED EPITAXIAL WAFER AND METHOD OF PRODUCING GALLIUM NITRIDE-BASED SEMICONDUCTOR LIGHT-EMITTING DEVICE

TECHNICAL FIELD

The present invention relates to a gallium nitride-based epitaxial wafer and a method of producing a gallium nitride-based semiconductor light-emitting device.

BACKGROUND ART

Patent Document 1 describes a gallium nitride-based semiconductor device having a gallium nitride-based semiconductor layer with good crystal quality. The gallium nitride-based semiconductor layer is provided on a main surface of the gallium nitride support substrate of the semiconductor light-emitting device. An angle (referred to as an off-angle) is formed between a line normal to the main surface of the gallium nitride support substrate and the C-axis of the gallium nitride support substrate. As the off-angle of the gallium nitride support substrate nears 0°, protrusions having the shape of a hexagonal pyramid are more often seen on the surface of the gallium nitride-based semiconductor layer. The angle is preferably less than 2°.

[Patent Document 1] Japanese Unexamined Patent Application Publication No. 2005-159047

DISCLOSURE OF INVENTION

Problems to be Solved by the Invention

According to a finding of the inventors, when an active layer including a gallium nitride-based semiconductor well layer containing indium as a Group III element, for example, an InGaN well layer, is formed on a gallium nitride substrate, the peak wavelength of light emitted from a gallium nitride-based semiconductor light-emitting device, for example, a light-emitting diode, has a distribution. When a light-emitting diode including an active layer having a similar quantum well structure is produced on a sapphire substrate, the peak wavelength of light emitted from this light-emitting diode does not have a large distribution width. In summary, according to this comparison, the peak wavelength of light emitted from a gallium nitride-based semiconductor light-emitting device has a wide distribution because of use of a gallium nitride substrate.

The inventors have performed various experiments for the purpose of finding the cause of such a distribution. The inventors have also studied for the purpose of reducing such a distribution.

The present invention has been accomplished under these circumstances. An object of the present invention is to provide a method of producing a gallium nitride-based semiconductor light-emitting device having a structure in which the distribution of the wavelength of light emitted from an active layer including a well layer on a gallium nitride substrate can be reduced. Another object of the present invention is to provide a gallium nitride-based epitaxial wafer with which such a semiconductor device is provided.

Means for Solving the Problems

A gallium nitride-based epitaxial wafer according to an aspect of the present invention includes (a) a gallium nitride substrate including a main surface; (b) one or more gallium nitride-based semiconductor films grown on the main surface of the gallium nitride substrate; and (c) an active layer including a quantum well structure, the active layer being grown on the gallium nitride-based semiconductor film. The active layer includes a well layer composed of a gallium nitride-based semiconductor containing indium as a Group III element. An off-angle between a line normal to the main surface and a C-axis of the gallium nitride substrate has a distribution over the main surface and also monotonically varies on a line segment extending from one point on the edge of the main surface to another point on the edge. The off-angle at a first point on the main surface is smaller than the off-angle at a second point on the main surface, and a thickness of the well layer on the first point is smaller than a thickness of the well layer on the second point.

Another aspect of the present invention is a method of producing a nitride semiconductor light-emitting device. This method includes (a) a step of simultaneously growing gallium nitride-based semiconductor films on main surfaces of a plurality of gallium nitride substrates placed on a susceptor of a metal-organic vapor phase epitaxy reactor; and (b) a step of forming an active layer including a quantum well structure on each gallium nitride-based semiconductor film with the metal-organic vapor phase epitaxy reactor by feeding a source gas. The active layer includes a well layer composed of a gallium nitride-based semiconductor containing indium as a Group III element. An off-angle between a line normal to the main surface of each gallium nitride substrate and a C-axis of the gallium nitride substrate has a distribution over the main surface and also monotonically varies on a line segment extending from one point on the edge of the main surface to another point on the edge. The off-angle at a first point on the main surface is smaller than the off-angle at a second point on the main surface, and a thickness of the well layer on the first point is smaller than a thickness of the well layer on the second point.

According to the studies performed by the inventors, the distribution of an off-angle in a main surface of a substrate influences the content of indium. The influence of an off-angle is inevitable when a gallium nitride-based semiconductor is grown. However, it has been found that, as a result of experiments performed by the inventors, the influence of an off-angle is partially cancelled out by the influence of the flow of a source gas when a gallium nitride substrate in which the distribution of the off-angle is controlled on a main surface of the substrate is used.

When crystal growth is conducted for a gallium nitride-based epitaxial wafer with an epitaxy reactor, the distribution of the wavelength of emitted light can be caused by the influence of the flow of a source gas. However, as a result of experiments and studies performed by the inventors, it has turned out that this is not a major cause of the distribution. In thorough experiments and studies, the inventors have focused attention on the difference between a sapphire substrate and a gallium nitride substrate and have found the following finding. The off-angle formed between a line normal to a main surface of a sapphire substrate and the C-axis of the main surface is distributed in a range of −0.1° to +0.1° in the wafer surface while the off-angle at the center portion of the substrate is 0.15°. In contrast, the off-angle formed between a line normal to a main surface of a gallium nitride substrate and the C-axis of the main surface is distributed over the entire main surface due to the production method of the gallium nitride substrate.

By using a controlled off-angle distribution and a controlled growth rate distribution, with a gallium nitride substrate in which an off-angle monotonically varies on a line segment extending from one point on the edge of a main surface to another point on the edge, a structure can be provided in which the off-angle at a first point on the substrate main surface is smaller than the off-angle at a second point on the substrate main surface, and a thickness of a well layer on the first point is smaller than a thickness of the well layer on the second point.

With such a gallium nitride-based epitaxial wafer, a semiconductor device can be provided that has a structure in which the distribution of the wavelength of light emitted from an active layer including a well layer on a gallium nitride substrate can be reduced.

In a gallium nitride-based epitaxial wafer according to the present invention, the orientation of the line segment corresponds to one of crystal orientations <1-100> and <11-20>. These crystal orientations are suitable for combining an off-angle distribution and a well width distribution.

In a preferred embodiment of a gallium nitride-based epitaxial wafer according to the present invention, the gallium nitride substrate includes an orientation flat and an edge substantially having a shape of a segment of a circle, and the orientation of the orientation flat corresponds to one of crystal orientations <1-100> and <11-20>. According to another preferred embodiment of a gallium nitride-based epitaxial wafer according to the present invention, the gallium nitride substrate includes an edge substantially having a shape of a circle, and the gallium nitride substrate includes a marker corresponding to one of crystal orientations <1-100> and <11-20>.

In a gallium nitride-based epitaxial wafer according to the present invention, a difference between a maximum value and a minimum value in the off-angle distribution along an axis running through the center of the main surface of the gallium nitride substrate is preferably 0.7° or less. This region is preferable for combining an off-angle distribution and a well width distribution.

In a preferred embodiment of a production method according to the present invention, the source gas for forming the active layer is fed in a direction across a main surface of the susceptor of the metal-organic vapor phase epitaxy reactor, and this feeding of the source gas causes a distribution of a growth rate of the well layer of the active layer in the direction in which the source gas flows.

This source gas flow can be applied to a gallium nitride substrate in which an off-angle monotonically varies on a line segment extending from one point on the edge of a main surface of the substrate to another point on the edge.

A production method according to the present invention may further include a step of placing the gallium nitride substrates on the susceptor. The line segment of each gallium nitride substrate is oriented in a direction of a certain axis.

As a result of placing a plurality of gallium nitride substrates on a susceptor of a metal-organic vapor phase epitaxy reactor so as to be oriented in the above-described way, the influence of the distribution of an off-angle can be reduced by using the influence originated from the source gas flow.

In another preferred embodiment of a production method according to the present invention, the source gas for forming the active layer is fed in a direction of an axis crossing a main surface of the susceptor, and this feeding of the source gas causes a distribution of a growth rate of the well layer of the active layer in a direction in which the source gas flows from upstream to downstream.

This source gas flow can be applied to a gallium nitride substrate in which an off-angle monotonically varies on a line segment extending from one point on the edge of a main surface of the substrate to another point on the edge.

A production method according to the present invention may further include a step of placing the gallium nitride substrates on the susceptor of a metal-organic vapor phase epitaxy reactor. The susceptor includes a plurality of guides for the gallium nitride substrates, the guides being provided on a circumference of a circle defined on the main surface of the susceptor. The line segment of each gallium nitride substrate is oriented in a direction so as to cross a tangential line of the circumference of the circle on the main surface of the susceptor. The crossing angle is, for example, a right angle.

As a result of placing a plurality of gallium nitride substrates on a susceptor of a metal-organic vapor phase epitaxy reactor so as to be oriented in the above-described way, the influence of the distribution of an off-angle can be reduced by using the influence originated from the source gas flow.

In a production method according to the present invention, the well layer is grown while the susceptor is rotated. As a result of the rotation of the susceptor, uniformity of crystal growth can be enhanced. Revolving of the susceptor also equalizes the influence of source gas flow that is asymmetrical or nonuniform.

The above-described object, another object, features, and advantages of the present invention will more readily become apparent from the following detailed description of preferred embodiments of the present invention with reference to attached drawings.

ADVANTAGES

As described above, according to the present invention, a method of producing a gallium nitride-based semiconductor light-emitting device is provided that has a structure in which the distribution of the wavelength of light emitted from an active layer including a well layer on a gallium nitride substrate can be reduced. According to the present invention, a gallium nitride-based epitaxial wafer with which such a semiconductor device is provided is also provided.

Figure 1A:
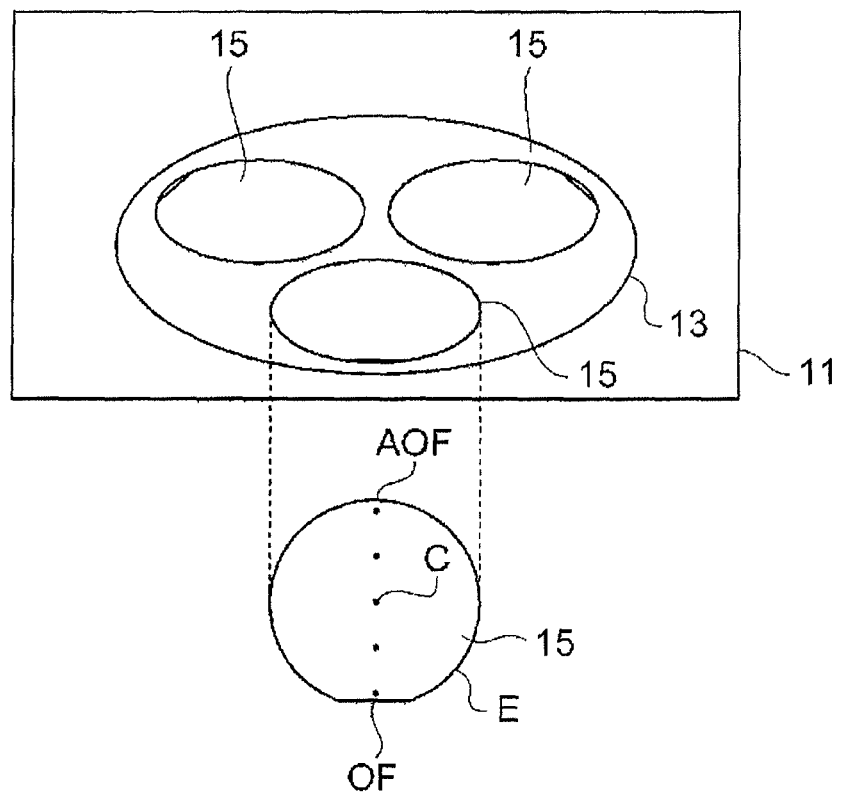
FIG. 1A shows the arrangement of sapphire substrates on a susceptor of a metal-organic vapor phase epitaxy reactor.

| Reference Numerals | |
| --- | --- |
| E1, E2, E3 | epitaxial wafer |
| E4 | gallium nitride-based epitaxial wafer |
| 11 | metal-organic vapor phase epitaxy reactor |
| 13 | susceptor |
| 15 | sapphire substrate |
| 41 | gallium nitride substrate |
| 41a | main surface of gallium nitride substrate |
| 43 | gallium nitride-based semiconductor film |
| 45 | active layer |
| 47 | quantum well structure |
| 47a | well layer |
| 47b | barrier layer |
| 49 | p-type cladding layer |
| 51 | p-type contact layer |
| 21 | metal-organic vapor phase epitaxy reactor |
| 23 | flow channel |
| 25 | susceptor |
| 25a | main surface of susceptor |
| 27a, 27b, 27c | GaN substrate |
| 31 | metal-organic vapor phase epitaxy reactor |
| 33 | flow channel |
| 35 | susceptor |
| 35a | main surface of susceptor |
| 37a, 37b, 37c | GaN substrate |

BEST MODES FOR CARRYING OUT THE INVENTION

The findings of the present invention can be readily understood in consideration of the following detailed description with reference to the attached drawings serving as examples. Hereinafter, embodiments of a gallium nitride-based epitaxial wafer and a method of producing a gallium nitride-based semiconductor light-emitting device according to the present invention are described with reference to the attached drawings. Where possible, like reference numerals are used to denote like elements.

First Embodiment

Figure 1B:
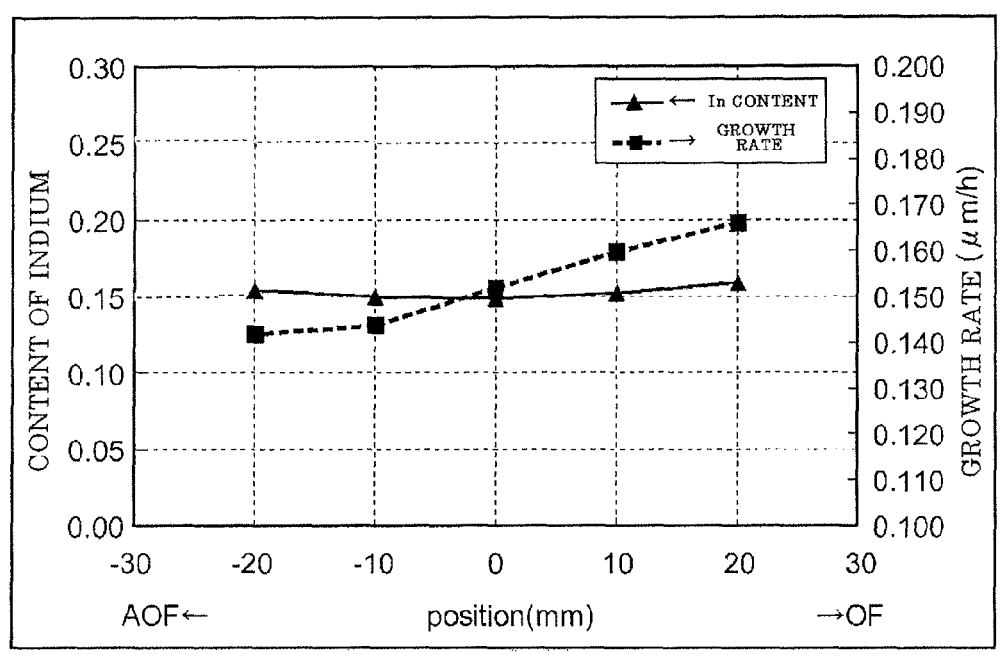
FIG. 1B shows the content of indium and the growth rate of an InGaN active layer.

FIGS. 1A and 1B show drawings for describing the growth of an InGaN active layer in which sapphire substrates are used. Referring to FIG. 1A, the arrangement of sapphire substrates 15 placed on a susceptor 13 of a metal-organic vapor phase epitaxy reactor 11 is shown. The sapphire substrates 15 are arranged such that the orientation flats (hereinafter, abbreviated as "OFs") of the sapphire substrates 15 are directed toward the edge of the susceptor 13. Referring to FIG. 1B, there are shown the content of indium and the growth rate of the InGaN layer at five measurement points on an axis extending from the "OF" of the sapphire substrate 15 through a central point C. In FIG. 1B, "AOF" denotes a point of intersection of the axis and the edge of the substrate. FIG. 1B shows that the content of indium is substantially constant over the main surface of the substrate while it slightly increases from the central point C toward the edge E of the substrate. This behavior in the content of indium is a result of the absence of a distribution of an off-angle over the main surface of the sapphire substrate. The growth rate of InGaN monotonically increases from AOF to OF. This behavior in the growth rate relates to the flow of sources (sources flowing from the upstream portion to the downstream portion of the flow channel) in the epitaxy reactor. When the growth rate is high, the incorporation level of indium increases and hence the content of indium increases.

An increase in the growth rate results in an increase in the thickness of a well layer. An increase in the thickness of the well layer and an increase in the content of indium both cause the PL wavelength to shift to a longer wavelength.

As described below, the inventors produced light-emitting devices such as light-emitting diodes by metal-organic vapor phase epitaxy with gallium nitride-based semiconductors. The sources used for the metal-organic vapor phase epitaxy were trimethylgallium (TMGa), trimethylaluminum (TMAl), trimethylindium (TMIn), ammonia ($NH_3$), silane ($SiH_4$), and cyclopentadienyl magnesium (Cp2Mg). Substrates were arranged in the following manner on the susceptor 13 of the metal-organic vapor phase epitaxy reactor 11.

| Epitaxial substrate | Type of substrate | Orientation of substrate |
| --- | --- | --- |
| E1: | sapphire substrate (0001) n-GaN template: | Normal orientation |
| E2: | GaN (0001) substrate, Off-angle distribution of 0.1° to 0.6°: | Normal orientation |
| E3: | GaN (0001) substrate, Off-angle distribution of 0.1° to 0.6°: | rotated by 90° from normal orientation |

In a sapphire substrate, the off-angle is well controlled such that the off-angle in a surface of the sapphire substrate is about −0.1° to +0.1° with respect to the off-angle at the center of the substrate. Thus, the off angle (angle between a line normal to the main surface and the C-axis of the substrate) is not distributed over the main surface. In a GaN (0001) substrate, the off-angle is distributed over a main surface of the substrate although the main surface is produced so as to be aligned with a (0001) plane. Such an off-angle distribution originates from the production method of GaN crystals.

These substrates are subjected to thermal cleaning. This cleaning is conducted, for example, at 1050° C. while the internal pressure of the reactor is controlled to be 101 kPa and $NH_3$ and $H_2$ are fed into the reactor. The cleaning period is, for example, 10 minutes.

An AlGaN film is subsequently deposited. Specifically, an n-AlGaN film is grown on each substrate by feeding TMGa, TMAl, $NH_3$, and $SiH_4$ into the reactor. The thickness of the film is, for example, 50 nm. The temperature at which the film is formed is, for example, 1050° C. The AlGaN film serves to flatten microroughness present on the surfaces of the GaN substrates.

The temperature in the reactor is subsequently changed to 1100° C. and a GaN film is deposited. Specifically, an n-GaN film is grown on each substrate by feeding TMGa, $NH_3$, and $SiH_4$ into the reactor. The thickness of the film is, for example, 2000 nm. The average rate of film growth is, for example, 4 μm per hour. The resultant GaN film serves, for example, as a cladding layer or a buffer layer.

A quantum well structure is subsequently formed. To form the quantum well structure, an InGaN film is formed on each substrate by feeding TMGa, TMIn, and $NH_3$ into the reactor. Specifically, an InGaN barrier layer and an InGaN well layer are alternately grown. The InGaN barrier layer has, for example, the thickness of 15 nm and a composition of $In_{0.01}Ga_{0.99}N$. The InGaN well layer has, for example, the thickness of 3 nm and a composition of $In_{0.14}Ga_{0.86}N$. The quantum well structure is, for example, a six-period structure.

An AlGaN film is subsequently deposited. Specifically, a p-AlGaN film is grown on each substrate by feeding TMGa, TMAl, $NH_3$, and Cp2Mg into the reactor. The thickness of the film is, for example, 20 nm. The temperature at which the film is formed is, for example, 1000° C. This Mg-doped AlGaN film can serve as a cladding layer or an electron blocking layer. A GaN film is further deposited. Specifically, a p-GaN film is grown on each substrate by feeding TMGa, $NH_3$, and Cp2Mg into the reactor. The thickness of the film is, for example, 50 nm. The temperature at which the film is formed is, for example, 1000° C. This Mg-doped GaN film can serve as a contact layer.

The thus-formed epitaxial substrates E1, E2, and E3 were measured for distributions of photoluminescence (PL) wavelengths. This measurement was conducted with a PL mapper system.

Figure 2:
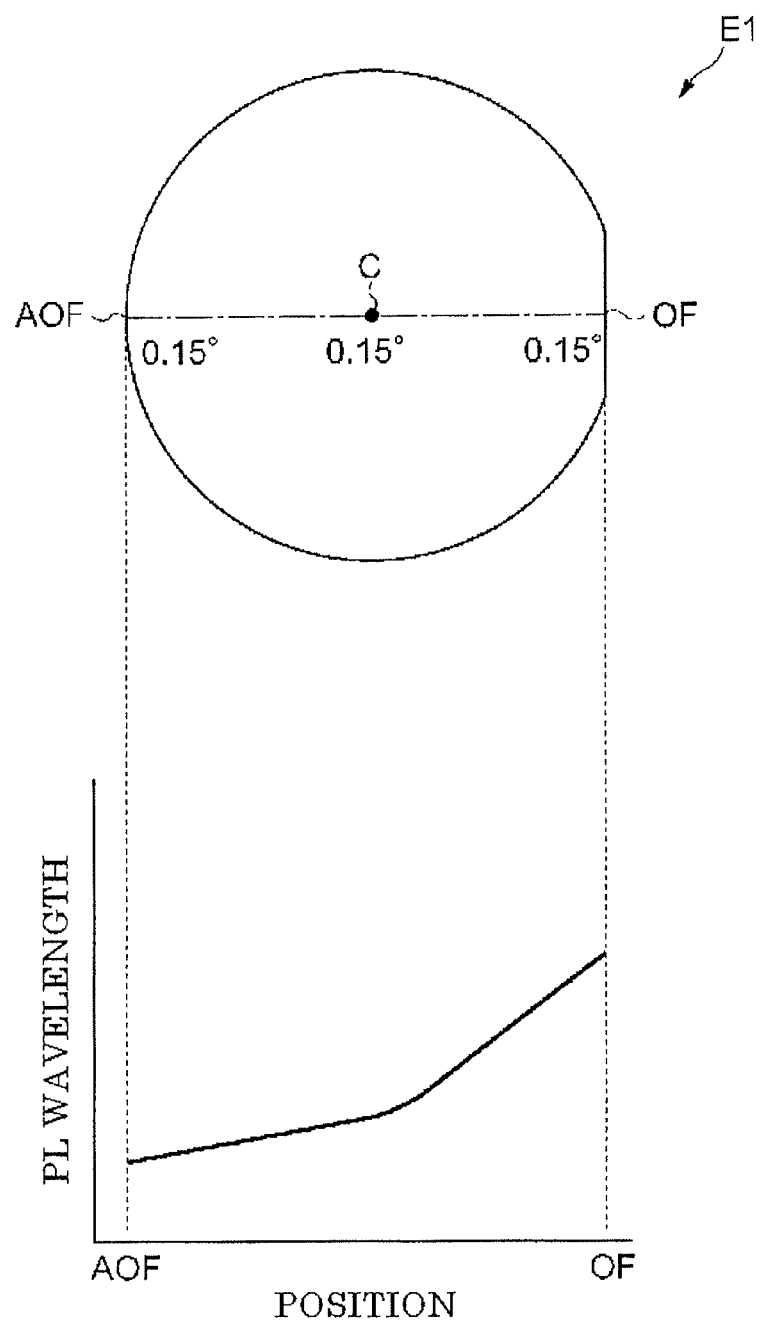
FIG. 2 shows the distribution of PL wavelengths on a line segment extending between OF and AOF in an epitaxial substrate E1.
Figure 3:
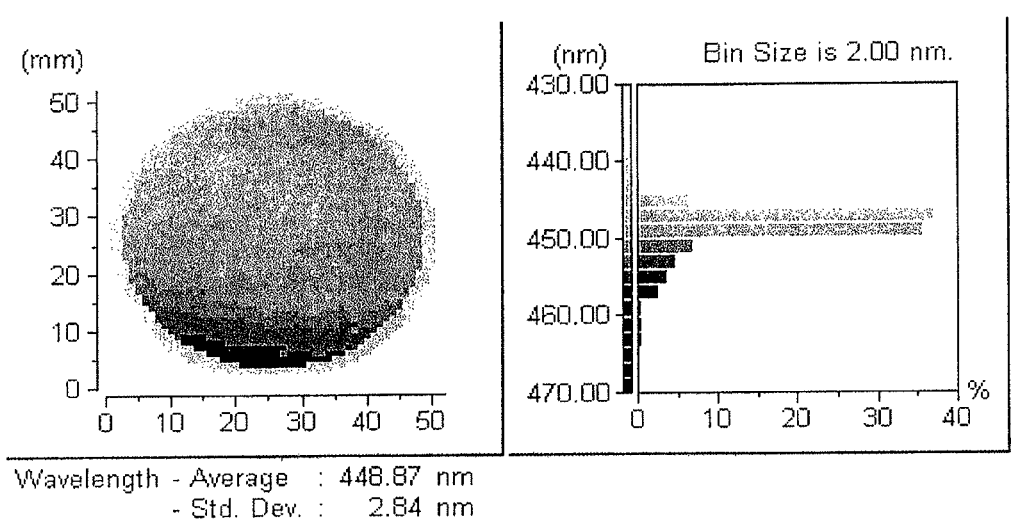
FIG. 3 shows a PL distribution measured with a PL mapper system and a histogram of the PL distribution.

FIG. 2 shows the distribution of PL wavelengths on a line segment extending between the point OF and the point AOF through the center in the epitaxial substrate E1. The off-angle in the main surface of the sapphire substrate is substantially constant, for example, 0.15°. FIG. 3 shows a PL distribution measured with the PL mapper system and a histogram of the PL distribution. The histogram shows the relationship between wavelengths and the numbers of samples at measurement points. The average of the PL wavelengths is 448.87 nm and the standard deviation of the PL wavelengths is 2.84 nm. Although there is no distribution of the off-angle in the main surface of the sapphire substrate, the distribution of the PL wavelength in the main surface of the sapphire substrate is caused by overlap between a relatively large distribution of the thickness of the well layer and a relatively small distribution of the content of indium.

Figure 4:
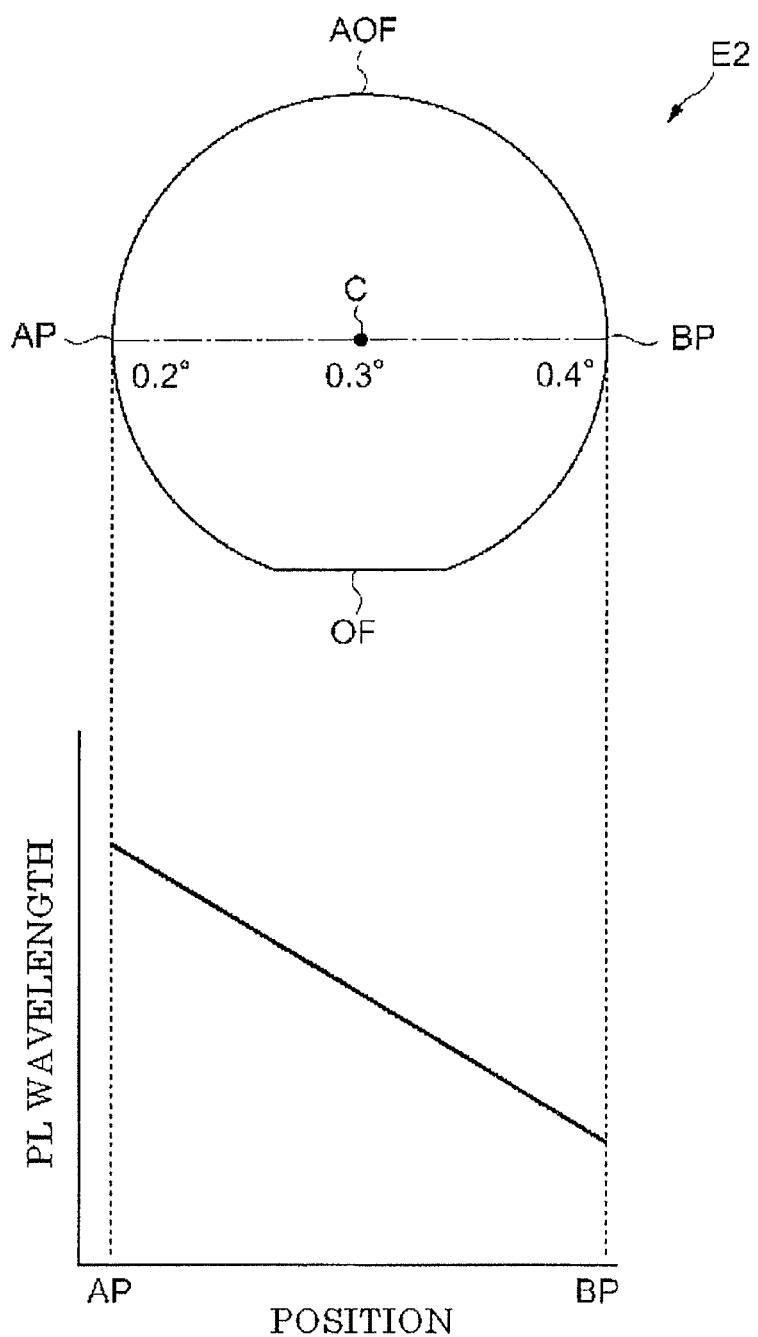
FIG. 4 shows the distribution of PL wavelengths on a line segment extending between a point AP and a point BP on the edge through a center C in an epitaxial substrate E2.
Figure 5:
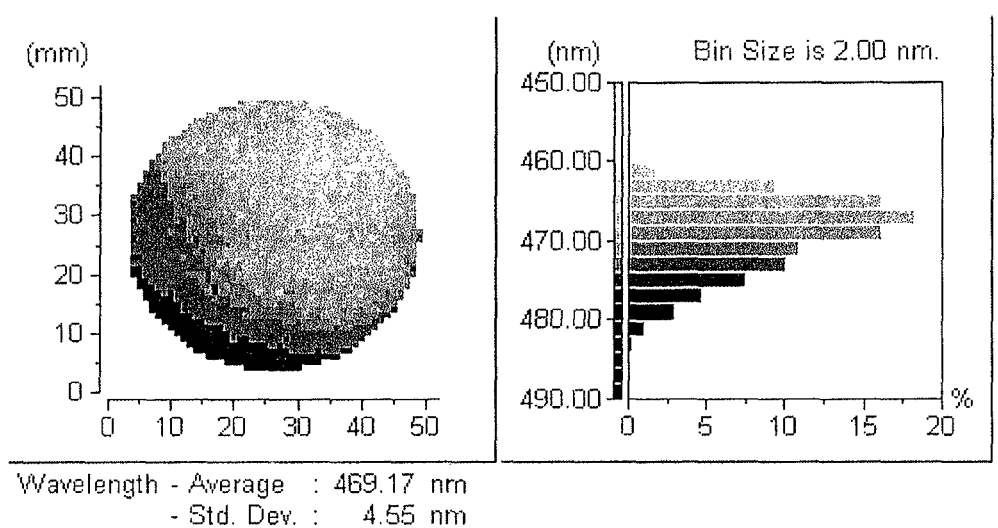
FIG. 5 shows a PL distribution measured with a PL mapper system and a histogram of the PL distribution.

FIG. 4 shows the distribution of PL wavelengths on a line segment extending between a point AP and a point BP on an edge through a center C in the epitaxial substrate E2. The off-angle in the main surface of the GaN substrate monotonically varies along the line segment. For example, the minimum value of the off-angle is 0.2° and the maximum value of the off-angle is 0.4°. FIG. 5 shows a PL distribution measured with the PL mapper system and a histogram of the PL distribution. The histogram shows the relationship between wavelengths and the numbers of samples at measurement points. The average of the PL wavelengths is 469.17 nm and the standard deviation of the PL wavelengths is 4.55 nm. The main surface of the GaN substrate inevitably has a distribution of the off-angle. This distribution of the off-angle influences the content of indium of the InGaN layer in the quantum well structure. When the off-angle is large, the content of indium becomes small. In addition to this influence, the flow of sources from the upstream portion to the downstream portion of the flow channel also influences the thickness of the InGaN layer in the quantum well structure.

Figure 6:
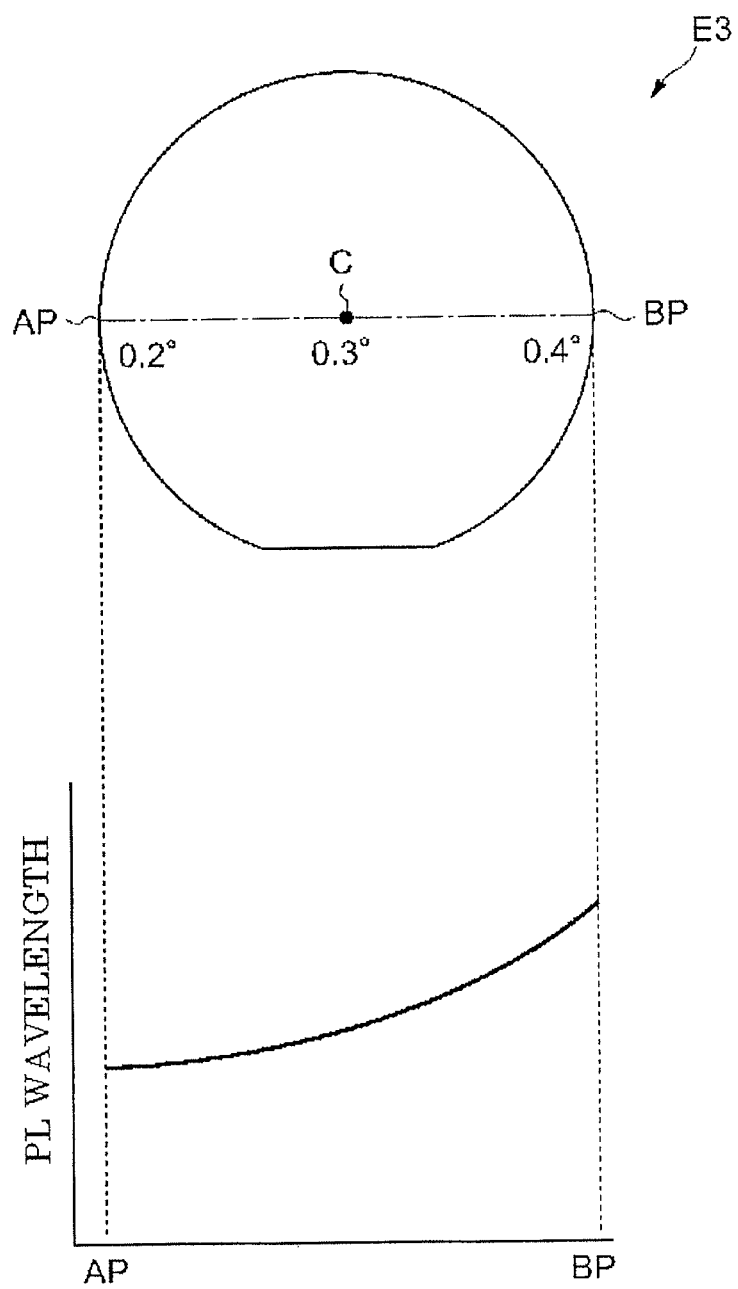
FIG. 6 shows the distribution of PL wavelengths on a line segment extending between a point AP and a point BP on the edge through a center C in an epitaxial substrate E3.
Figure 7:
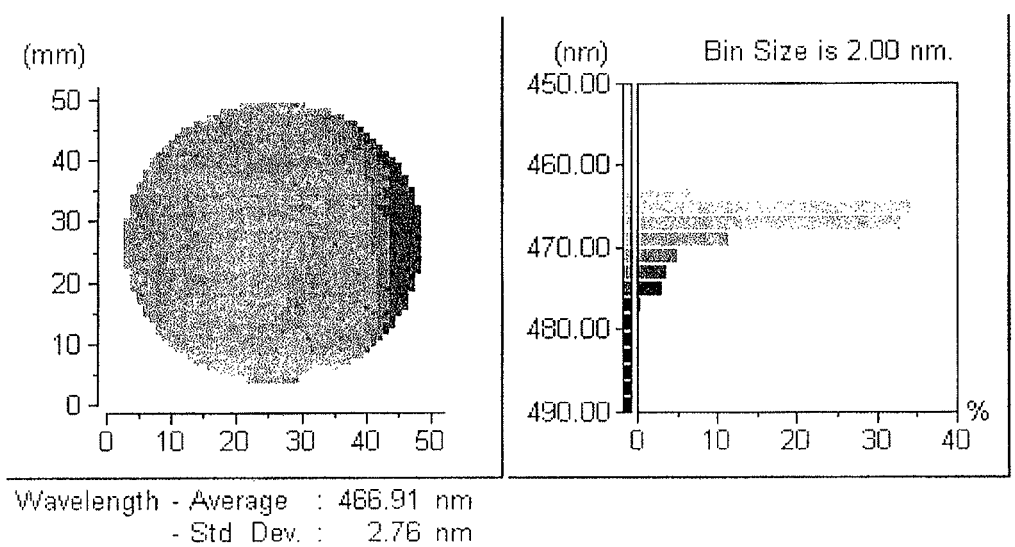
FIG. 7 shows a PL distribution measured with a PL mapper system and a histogram of the PL distribution.

FIG. 6 shows the distribution of PL wavelengths on a line segment extending between a point AP and a point BP on an edge through a center C in the epitaxial substrate E3. The off-angle in the main surface of the GaN substrate monotonically varies along the line segment. For example, the minimum value of the off-angle is 0.2° and the maximum value of the off-angle is 0.4°. FIG. 7 shows a PL distribution measured with the PL mapper system and a histogram of the PL distribution. The histogram shows the relationship between wavelengths and the numbers of samples at measurement points. The average of the PL wavelengths is 466.91 nm and the standard deviation of the PL wavelengths is 2.76 nm. The main surface of the GaN substrate inevitably has a distribution of the off-angle. This distribution of the off-angle influences the content of indium of the InGaN layer in the quantum well structure. In addition to this influence, the flow of sources from the upstream portion to the downstream portion of the flow channel also influences the thickness of the InGaN layer in the quantum well structure. In a region having a large off-angle, the InGaN layer has a large thickness.

The GaN substrates of the epitaxial substrates E2 and E3 have the same off-angle distribution. However, the standard deviation (2.76 nm) of the PL wavelengths of the epitaxial substrate E3 is considerably smaller than the standard deviation (4.55 nm) of the PL wavelengths of the epitaxial substrate E2. This is because the distribution of the PL wavelengths is reduced by utilizing the distribution of the off-angle in the main surface of the GaN substrate and the distribution of the growth rate caused by the flow of the sources.

Figure 8:
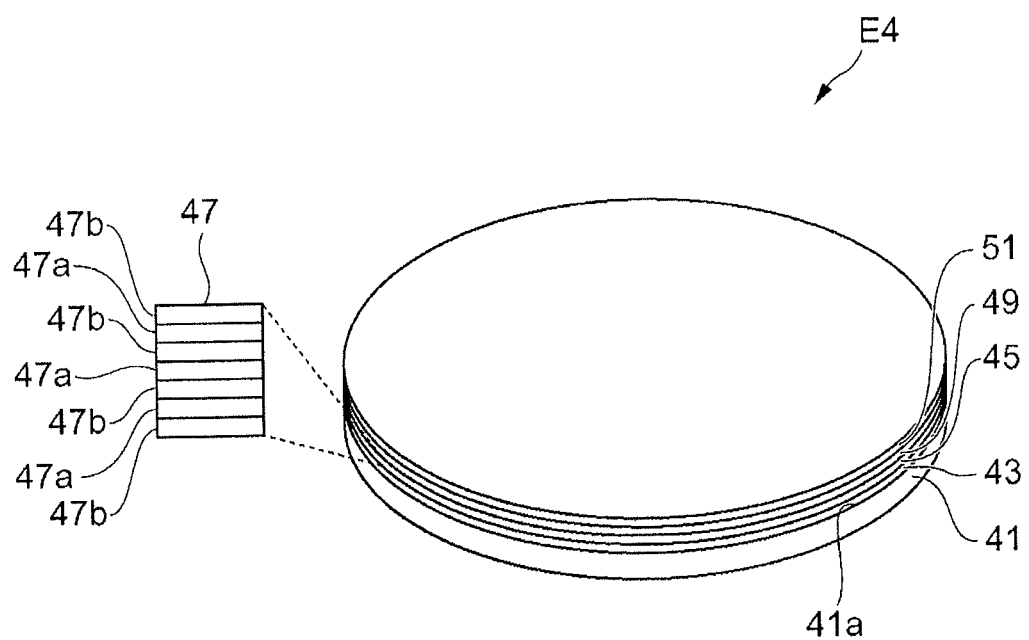
FIG. 8 shows a gallium nitride-based epitaxial wafer according to an embodiment of the present invention.
Figure 8A:
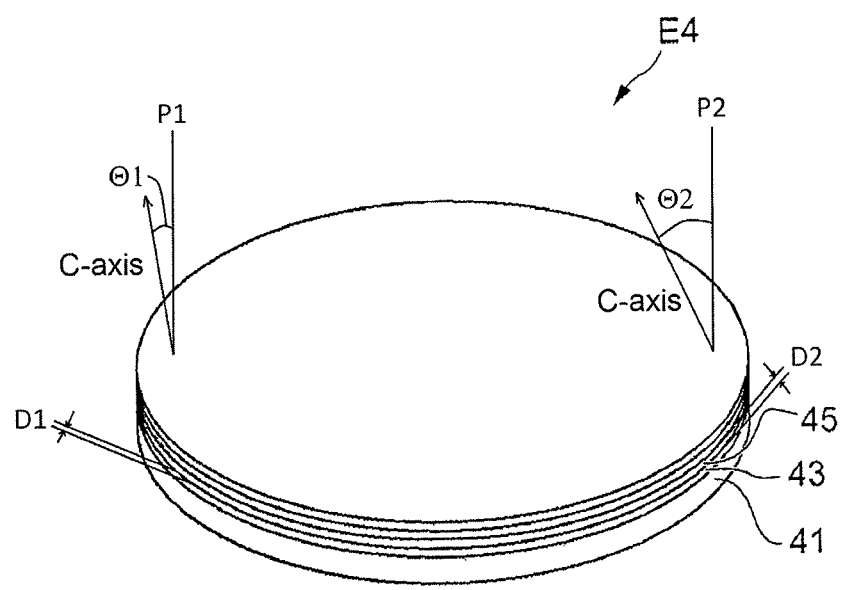
FIG. 8A shows the gallium nitride-based epitaxial wafer of FIG. 8.

FIG. 8 shows a gallium nitride-based epitaxial wafer according to an embodiment of the present invention. This gallium nitride-based epitaxial wafer E4 includes a gallium nitride substrate 41, one or more gallium nitride-based semiconductor films 43, and an active layer 45. The gallium nitride-based semiconductor film 43 is grown on a main surface 41a of the gallium nitride substrate. The active layer 45 is grown on the gallium nitride-based semiconductor film and includes a quantum well structure 47. The quantum well structure 47 includes well layers 47a and barrier layers 47b alternately provided. The well layers 47a are composed of a gallium nitride-based semiconductor containing indium as a Group III element. The thickness of the well layers 47a is distributed over the entirety of the main surface 41a. The off-angle between the C-axis of gallium nitride of the GaN substrate and a line normal to the main surface of the GaN substrate has a distribution over the substrate main surface 41a and, as shown in FIG. 6, also monotonically varies on a line segment extending from one point on the edge of the substrate main surface 41a to another point on the edge. Referring to FIG. 8A, off-angle (THETA1) at the first point P1 on the substrate main surface 41a is smaller than the off-angle (THETA2) at the second point P2 on the substrate main surface 41a (THETA2>THETA1). The thickness D1 of the well layers 47a on the first point P1 is smaller than the thickness D2 of the well layers 47a on the second point P2 (D1 <D2). The gallium nitride-based semiconductor film 43 may be, for example, an n-type cladding layer or a buffer layer. If necessary, a gallium nitride-based epitaxial wafer E4 may include one or more gallium nitride-based semiconductor films provided on the active layer 45 and the gallium nitride-based semiconductor film may include, for example, a p-type cladding layer 49 and a p-type contact layer 51.

As described above, when crystal growth is conducted for forming a gallium nitride-based epitaxial wafer with an epitaxial reactor, the flow of a source gas causes a distribution of the wavelength of emitted light. When attention is focused on the difference between a sapphire substrate and a gallium nitride substrate, a sapphire substrate has a main surface having a uniform crystal plane whereas a gallium nitride substrate has a main surface over the entirety of which the off-angle is distributed.

According to studies conducted by the inventors, such a distribution of the off-angle influences the content of indium of a GaN-based semiconductor. This influence of the off-angle inevitably occurs in the production of a gallium nitride-based semiconductor. However, the inventors have found that, as a result of experiments, the influence of the off-angle is partially cancelled out by the influence of the flow of a source gas when a gallium nitride substrate in which the distribution of the off-angle is controlled on a main surface of the substrate is used.

Specifically, with a gallium nitride substrate in which the off-angle monotonically varies on a line segment extending from one point on the edge of a main surface of the substrate to another point on the edge, a structure can be provided in which the off-angle at the first point on the main surface is smaller than the off-angle at the second point on the main surface and the thickness of a well layer on the first point is smaller than the thickness of the well layer on the second point.

With such a gallium nitride-based epitaxial wafer, a semiconductor device can be provided that have a structure in which the distribution of the wavelength of light emitted from an active layer including a well layer on a gallium nitride substrate can be reduced.

The orientation of the line segment corresponds to one of the crystal orientations <1-100> and <11-20> in a gallium nitride-based epitaxial wafer. These crystal orientations are suitable when the off-angle distribution and the well-width distribution are combined.

In a preferred embodiment of a gallium nitride-based epitaxial wafer, a gallium nitride substrate includes an orientation flat and an edge substantially having the shape of a segment of a circle and the orientation of the orientation flat corresponds to one of the crystal orientations <1-100> and <11-20>. Alternatively, in another preferred embodiment of a gallium nitride-based epitaxial wafer, a gallium nitride substrate includes an edge substantially having the shape of a circle and the gallium nitride substrate includes a marker corresponding to one of the crystal orientations <1-100> and <11-20>.

A gallium nitride-based epitaxial wafer preferably has a difference of 0.7° or less between the maximum value and the minimum value in the off-angle distribution along the axis running through the center of a main surface of a gallium nitride substrate. This range is suitable for combining the off-angle distribution and the well-width distribution.

Second Embodiment

Figure 9:
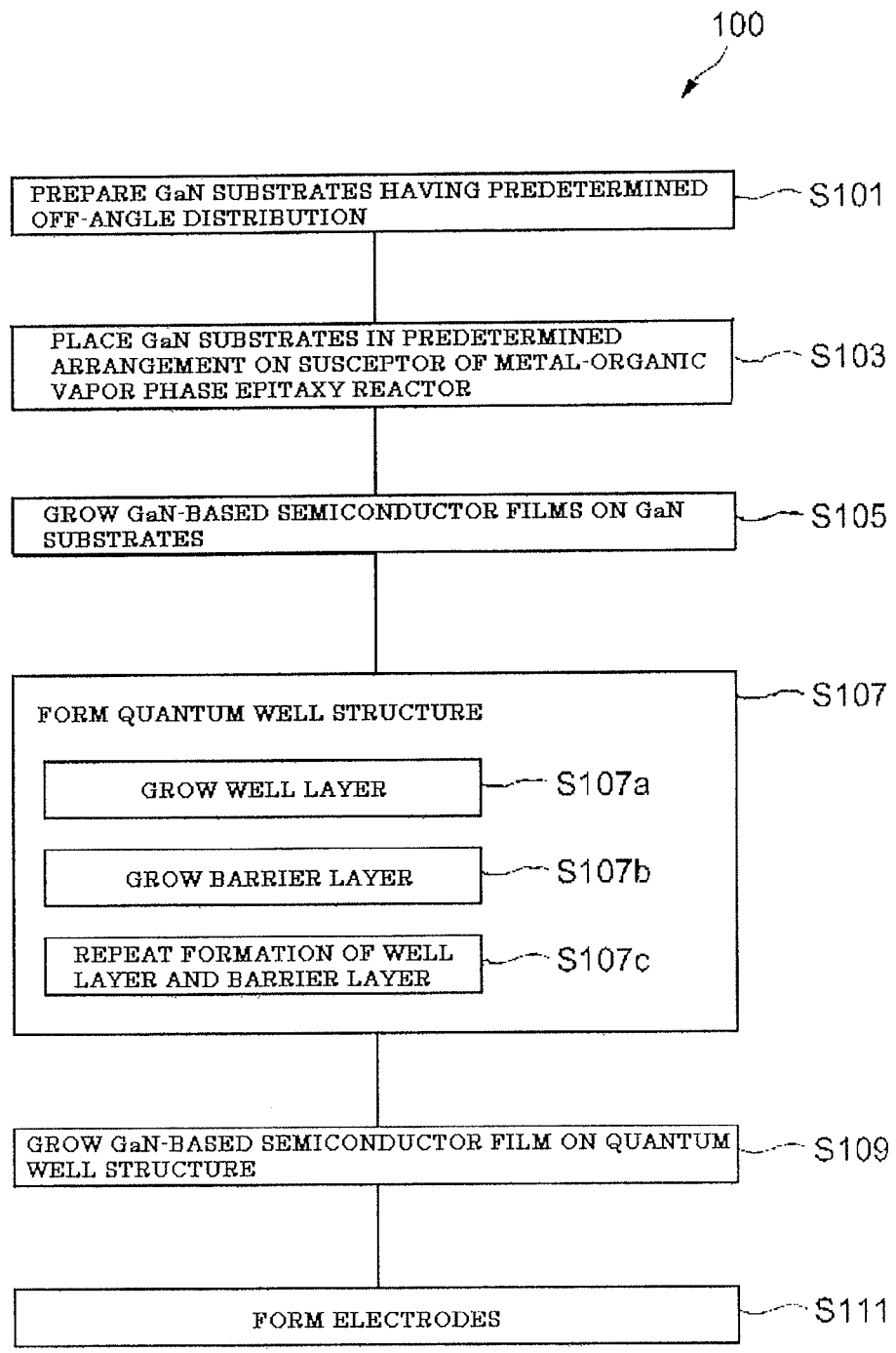
FIG. 9 shows a flow chart including major steps of a method of producing a nitride semiconductor light-emitting device according to an embodiment of the present invention.

FIG. 9 shows a flow chart including major steps of a method of producing a nitride semiconductor light-emitting device according to an embodiment of the present invention. Referring to a flow chart 100, in a step S101, GaN substrates having the above-described off-angle distribution are prepared. The off-angle is distributed over a main surface of each substrate and monotonically varies on a line segment extending from one point on the edge of the main surface to another point on the edge through the central point of the main surface. Neither the minimum point nor the maximum point of the off-angle is present in the substrate main surface. An iso-off-angle line, which runs through points having an identical off-angle, extends from one point to another point on the edge of the GaN substrate and the iso-off-angle line is constituted by a curve and/or a line segment. According to an embodiment, the radius of curvature of the iso-off-angle line is preferably larger than the radius of curvature of the contour of the GaN substrate. In this case, the off-angle distribution varies considerably mildly on the main surface.

Figure 10:
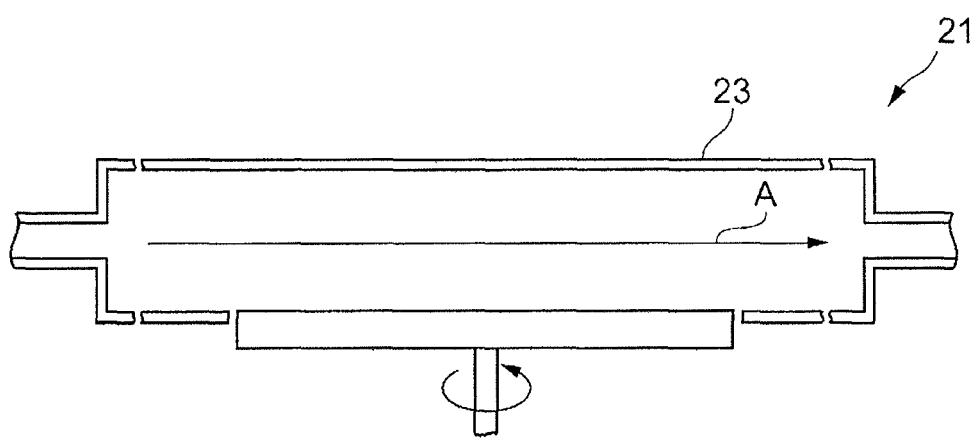
FIG. 10 schematically shows a metal-organic vapor phase epitaxy reactor having a preferred configuration.
Figure 11:
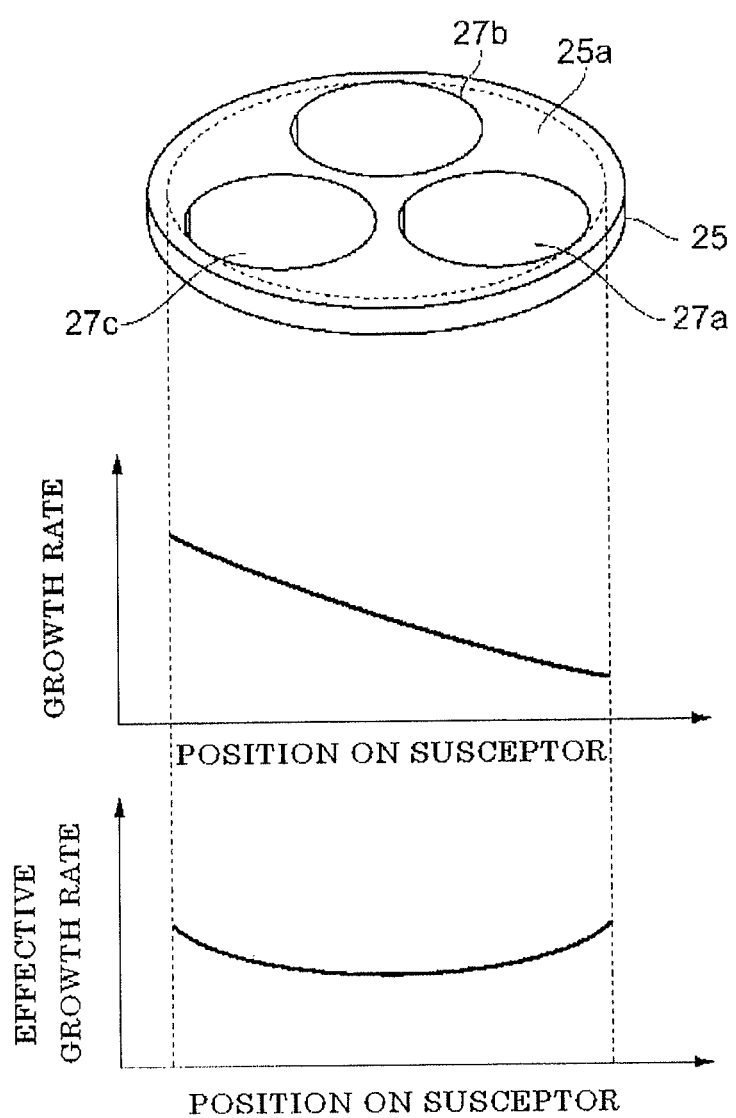
FIG. 11 shows the arrangement of GaN substrates on a susceptor, the distribution of the growth rate of a semiconductor layer and the distribution of the effective growth rate of the semiconductor layer.

FIG. 10 schematically shows a metal-organic vapor phase epitaxy reactor having a preferred configuration. Referring to FIG. 11, in a step S103, GaN substrates 27a, 27b, and 27c are placed in a predetermined arrangement on the susceptor of the metal-organic vapor phase epitaxy reactor. As shown in FIG. 11, each line segment extending from one point on the edge of each substrate main surface to another point on the edge is directed in the same direction. The orientations of the GaN substrates 27a, 27b, and 27c are represented by the orientations of the orientation flats in the example shown in FIG. 11.

In a metal-organic vapor phase epitaxy reactor 21, a source gas flows through a flow channel 23. The plurality of GaN substrates 27a to 27c are placed on a main surface 25a of a susceptor 25. These GaN substrates 27a to 27c are placed in guides of the main surface 25a. A source gas (for example, a source gas for forming an active layer) is fed in the direction (the direction represented by arrow A) across the main surface 25a of the susceptor 25 of the metal-organic vapor phase epitaxy reactor 21. As shown in FIG. 11, such feeding of a source gas causes a distribution of the growth rate of a semiconductor layer in the direction in which the source flows. The orientation flats are oriented in accordance with the distribution of the growth rate.

A semiconductor layer is grown while the susceptor 25 is rotated. Such rotation of the susceptor 25 enhances the uniformity of crystal growth. Revolving of the susceptor 25 equalizes the influence of source gas flow that is asymmetrical or nonuniform. This rotation changes the growth rate distribution shown in FIG. 11 into the effective growth rate distribution shown in FIG. 11.

This source gas flow can be applied to the gallium nitride substrates 27a to 27c in which the off-angle monotonically varies on a line segment extending from one point on the edge of the substrate main surface to another point on the edge. The line segments of the gallium nitride substrates 27a to 27c are oriented in a direction of a predetermined axis. By placing the plurality of gallium nitride substrates 27a to 27c on the susceptor 25 of the metal-organic vapor phase epitaxy reactor 21 in this orientation, the influence of the distribution of the off-angle can be reduced by using the above-described influence of source gas flow.

In a step S105, a GaN-based semiconductor film is grown on the GaN substrate. This GaN-based semiconductor film is formed before the formation of a quantum well structure. The GaN-based semiconductor film is formed by depositing, for example, an n-type semiconductor for a buffer layer or a cladding layer. Examples of this semiconductor include GaN, AlGaN, AlInGaN or the like.

In a step S107, the quantum well structure is formed. To form the quantum well structure, a well layer is grown in a step S107a and a barrier layer is grown in a step S107b. If necessary, the growth of the well layer and the barrier layer is repeated in a step S107c. The well layer can be grown with a gallium nitride-based semiconductor containing indium as a Group III. Examples of this gallium nitride-based semiconductor include InGaN and AlInGaN. The barrier layer can be grown with a gallium nitride-based semiconductor containing indium as a Group III. Examples of this gallium nitride-based semiconductor include InGaN and AlInGaN. The thickness of the well layer has a distribution on the main surface due to the influence originated from source gas flow. The content of indium has a distribution due to the influence of the distribution of the off-angle.

As described above, this distribution of the off-angle influences the crystal growth rate. The influence of the off-angle is inevitable when a gallium nitride-based semiconductor is produced. However, the influence of the off-angle is partially cancelled out by the influence of the flow of a source gas when a gallium nitride substrate in which the distribution of the off-angle is controlled on a main surface of the substrate is used.

When crystal growth is conducted for forming a gallium nitride-based epitaxial wafer with the epitaxy reactor 21, the wavelength of emitted light has a distribution by the influence of the flow of a source gas. This distribution of the wavelength of emitted light can be reduced by using a gallium nitride substrate in which the off-angle monotonically varies on a line segment extending from one point on the edge of a main surface of the substrate to another point on the edge and combining the distribution of the off-angle over the entirety of the substrate main surface with the influence of the flow of a source gas. As a result, a structure can be provided in which the off-angle at the first point on the substrate main surface is smaller than the off-angle at the second point on the substrate main surface, and the thickness of the well layer on the first point is smaller than the thickness of the well layer on the second point. Thus, with such a gallium nitride-based epitaxial wafer, a semiconductor device can be provided that has a structure in which the distribution of the wavelength of light emitted from an active layer including a well layer on a gallium nitride substrate can be reduced.

In a step S109, a GaN-based semiconductor film is grown on the quantum well structure. The GaN-based semiconductor film is formed by depositing, for example, a p-type semiconductor for a cladding layer or a contact layer. Examples of this semiconductor include GaN, AlGaN, and AlInGaN.

In a step S111, a first electrode, for example, an anode, is formed on the contact layer and a second electrode, for example, a cathode, is formed on the back surface of the GaN substrate.

Figure 12:
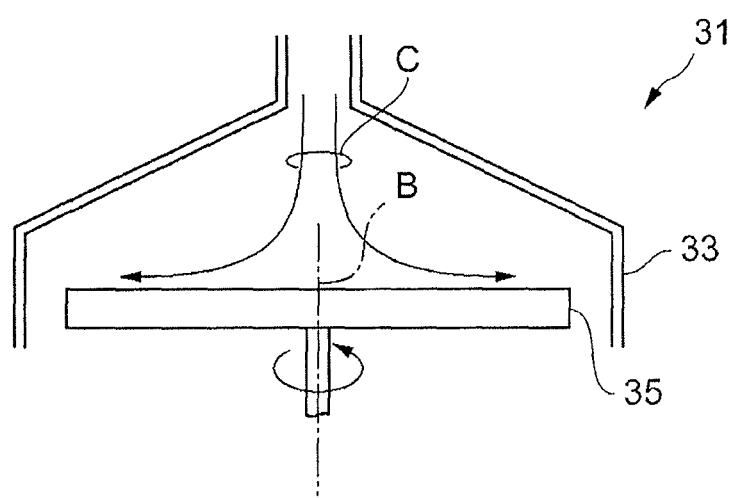
FIG. 12 schematically shows a metal-organic vapor phase epitaxy reactor having another preferred configuration.
Figure 13:
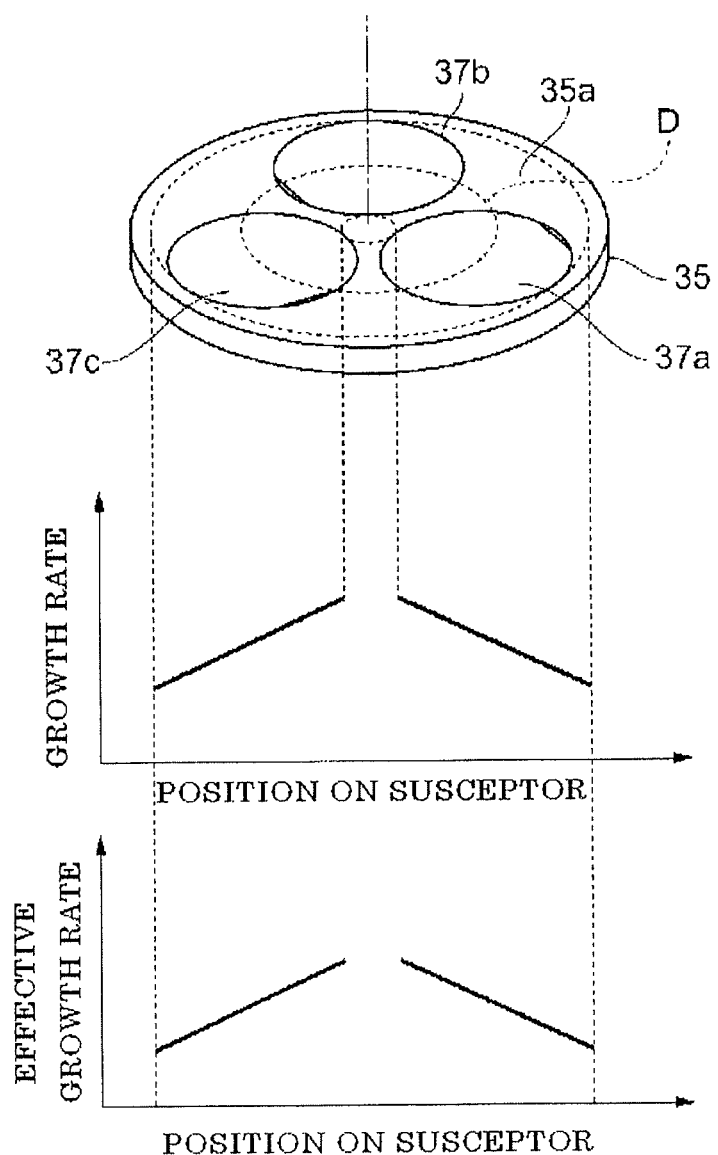
FIG. 13 shows the arrangement of GaN substrates on a susceptor, the distribution of the growth rate of a semiconductor layer and the distribution of the effective growth rate of the semiconductor layer.

FIG. 12 schematically shows a metal-organic vapor phase epitaxy reactor having another preferred configuration. Referring to FIG. 13, in a step S103, GaN substrates 37*a*, 37*b*, and 37*c* are placed in a predetermined arrangement on the susceptor of the metal-organic vapor phase epitaxy reactor. As shown in FIG. 13, each line segment extending from one point on the edge of each substrate main surface to another point on the edge is oriented in the direction of the flow of a source gas. The orientations of the GaN substrates 37*a*, 37*b*, and 37*c* are represented by the orientations of the orientation flats in the example shown in FIG. 13.

In a metal-organic vapor phase epitaxy reactor 31, a source gas flows through a flow channel 33. The plurality of GaN substrates 37*a* to 37*c* are placed on a main surface 35*a* of a susceptor 35. These GaN substrates 37*a* to 37*c* are placed in the guides of the main surface 35*a*. A source gas (for example, a source gas for forming an active layer) is fed along a B axis (in the direction represented by arrow C) crossing the main surface 35*a* of the susceptor 35. This feeding of the source gas causes the distribution of the growth rate of the well layer in the direction in which the source gas flows from the upstream portion to the downstream portion. As shown in FIG. 13, the distribution of the growth rate of the semiconductor layer is caused in the direction in which the source flows by this feeding of the source gas. The orientation flats are oriented in accordance with the distribution of the growth rate.

A semiconductor layer is grown while the susceptor 35 is rotated. Such rotation of the susceptor 35 enhances the uniformity of crystal growth. Revolving of the susceptor 35 equalizes the influence of source gas flow that is asymmetrical or nonuniform. This rotation changes the growth rate distribution shown in FIG. 13 into the effective growth rate distribution shown in FIG. 13.

This source gas flow can be applied to the gallium nitride substrates 37*a* to 37*c* in which the off-angle monotonically varies on a line segment extending from one point on the edge of the substrate main surface to another point on the edge. The susceptor 35 includes a plurality of guides for gallium nitride substrates, the guides being provided on the circumference D of a circle defined on the main surface 35*a* of the susceptor 35. The line segments of the gallium nitride substrates 37*a* to 37*c* are oriented in a direction of line segments crossing tangential lines of the circumference D of the circle on the main surface 35*a* of the susceptor 35.

By placing the plurality of gallium nitride substrates 37*a* to 37*c* on the susceptor of the metal-organic vapor phase epitaxy reactor in the above-described orientations, the influence of the distribution of the off-angle can be reduced by using the above-described influence originated from the flow of a source gas. By placing the plurality of gallium nitride substrates 37*a* to 37*c* on the susceptor 35 of the metal-organic vapor phase epitaxy reactor 31 in the above-described orientations, the influence of the distribution of the off-angle can be reduced by using the above-described influence originated from the flow of a source gas.

The principles of the present invention have been described with preferred embodiments with reference to the drawings. However, it will be apparent to one skilled in the art that the present invention can be changed in terms of arrangement and details without departing from the principles. The present invention is not restricted to the specific configurations disclosed in the embodiments. Although an example in which three substrates are placed on the susceptor is described in the embodiments, more substrates can also be placed on a susceptor. Therefore, the present invention embraces all modifications and changes within the spirit and scope of the appended claims.

The invention claimed is:

1. A gallium nitride-based epitaxial wafer comprising:
   a gallium nitride substrate including a main surface;
   one or more gallium nitride-based semiconductor films grown on the main surface of the gallium nitride substrate; and
   an active layer including a quantum well structure, the active layer being grown on the gallium nitride-based semiconductor film;
   wherein the active layer includes a well layer composed of a gallium nitride-based semiconductor containing indium as a Group III element,
   an off-angle between a line normal to the main surface and a C-axis of the gallium nitride substrate has a distribution over the main surface and also monotonically varies on a line segment extending from one point on an edge of the main surface to another point on the edge, and
   the off-angle at a first point on the main surface is smaller than the off-angle at a second point on the main surface, and a thickness of the well layer on the first point is smaller than a thickness of the well layer on the second point,
   wherein a reference plane is defined by the line segment and the <1-100> crystal axis or the <11-20> crystal axis, and the line segment is oriented such that the reference plane is orthogonal to the main surface.

2. The gallium nitride-based epitaxial wafer according to claim 1, wherein the gallium nitride substrate includes an orientation flat and an edge substantially having a shape of a segment of a circle defined by a central point, and
   an orientation of the orientation flat corresponds to one of crystal orientations <1-100> and <11-20>.

3. The gallium nitride-based epitaxial wafer according to claim 1, wherein the gallium nitride substrate includes an edge substantially having a shape of a circle defined by a central point, and the gallium nitride substrate includes a marker corresponding to one of crystal orientations <1-100> and <11-20>.

4. The gallium nitride-based epitaxial wafer according to claim 1, wherein a difference between a maximum value and a minimum value in the off-angle distribution along an axis running through a central point of the main surface of the gallium nitride substrate is 0.7° or less.

5. A method of producing a nitride semiconductor light-emitting device comprising:

a step of simultaneously growing gallium nitride-based semiconductor films on main surfaces of a plurality of gallium nitride substrates placed on a susceptor of a metal-organic vapor phase epitaxy reactor; and a step of forming an active layer including a quantum well structure on each of the gallium nitride-based semiconductor film with the metal-organic vapor phase epitaxy reactor by feeding a source gas, wherein the active layer includes a well layer composed of a gallium nitride-based semiconductor containing indium as a Group III element, an off-angle between a line normal to the main surface of each gallium nitride substrate and a C-axis of the gallium nitride substrate has a distribution over the main surface and also monotonically varies on a line segment extending from one point on an edge of the main surface to another point on the edge, and the off-angle at a first point on the main surface is smaller than the off-angle at a second point on the main surface, and a thickness of the well layer on the first point is smaller than a thickness of the well layer on the second point, wherein a reference plane is defined by the line segment and the <1-100> crystal axis or the <11-20> crystal axis, and the line segment is oriented such that the reference plane is orthogonal to the main surface.

6. The method according to claim 5, wherein the source gas for forming the active layer is fed in a direction across a main surface of the susceptor, and this feeding of the source gas causes a distribution of a growth rate of the well layer of the active layer in the direction in which the source gas flows.

7. The method according to claim 6, further comprising a step of placing the gallium nitride substrates on the susceptor, wherein the line segment of each gallium nitride substrate is oriented in a direction of a certain axis.

8. The method according to claim 5, wherein the source gas for forming the active layer is fed in a direction of an axis crossing a main surface of the susceptor, and this feeding of the source gas causes a distribution of a growth rate of the well layer of the active layer in a direction in which the source gas flows from upstream to downstream.

9. The method according to claim 8, further comprising a step of placing the gallium nitride substrates on the susceptor, wherein the susceptor includes a plurality of guides for the gallium nitride substrates, the guides being provided on a circumference of a circle defined on the main surface of the susceptor, and the line segment of each gallium nitride substrate is oriented in a direction so as to cross a tangential line of the circumference of the circle on the main surface of the susceptor.

10. The method according to claim 5, wherein the well layer is grown while the susceptor is rotated.

* * * * *